United States Patent
Hoshino

(10) Patent No.: US 11,209,374 B2
(45) Date of Patent: Dec. 28, 2021

(54) OPTICAL CHARACTERISTICS MEASURING DEVICE AND OPTICAL CHARACTERISTICS MEASURING METHOD

(71) Applicant: TOSHIBA MEMORY CORPORATION, Tokyo (JP)

(72) Inventor: Ken Hoshino, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 373 days.

(21) Appl. No.: 16/285,196

(22) Filed: Feb. 25, 2019

(65) Prior Publication Data
US 2020/0064279 A1    Feb. 27, 2020

(30) Foreign Application Priority Data

Aug. 27, 2018  (JP) .............................. JP2018-158564

(51) Int. Cl.
| | |
|---|---|
| *G01N 22/02* | (2006.01) |
| *G01N 21/956* | (2006.01) |
| *G01N 21/95* | (2006.01) |

(52) U.S. Cl.
CPC ......... *G01N 22/02* (2013.01); *G01N 21/9501* (2013.01); *G01N 21/95607* (2013.01); *G01N 2021/95615* (2013.01)

(58) Field of Classification Search
CPC ............... G01N 22/02; G01N 21/9501; G01N 21/95607; G01N 21/9503; G01N 21/9505; H01N 2021/95615
USPC ......................................................... 324/642
See application file for complete search history.

(56) References Cited

U.S. PATENT DOCUMENTS

| | | | |
|---|---|---|---|
| 2017/0194218 A1* | 7/2017 | Kawakami | .............. H01L 22/14 |
| 2020/0057006 A1* | 2/2020 | Shaner | ................... G01N 22/02 |

OTHER PUBLICATIONS

"Charge-carrier kinetics in semiconductors by microwave conductivity measurements" By C. Swiatkowski, A. Sanders, K.-D. Buhre, and M. Kunst Journal of Applied Physics 78, 1763 (1995).
"Derivation of the low-energy optical-absorption spectra of a-Si:H from photoconductivity" by G.Moddel et.al, Phys Rev B, vol. 22, No. 4, pp. 1918-1925 (1980).
(Continued)

*Primary Examiner* — Judy Nguyen
*Assistant Examiner* — Rahul Maini
(74) *Attorney, Agent, or Firm* — Foley & Lardner LLP

(57) ABSTRACT

An optical characteristics measuring device includes a first light source capable of irradiating a sample with light and a second light source capable of irradiating the sample with microwaves. A measuring device measures microwave power of the reflection of the microwaves from the sample. A calculation unit calculates a parameter relating to the electrical conductivity of the sample using the microwave power of the reflected waves measured by the measuring device. A control unit controls the intensity of the light of the first light source so that the parameter becomes approximately a predetermined value. The calculation unit specifies first to n-th intensities of the light at which the parameter becomes approximately the predetermined value for each of the first to n-th wavelengths of the light and obtains relationships between the first to n-th wavelengths and the first to n-th intensities corresponding to the respective first to n-th wavelengths.

12 Claims, 3 Drawing Sheets

(56) References Cited

OTHER PUBLICATIONS

"Determination of Shallow Acceptor Concentration in SI—GaAs from Steady-State and Transient Microwave Photoconductivity Measurements" by M.S Wang, J.M.Borrego J Electrochem Soc vol. 137 No. 11, pp. 3648-3652 (1990).

"Gap-State Distribution in n-TYPE and p-TYPE a-Si From Opticalabsorption" by K.Pierz, B.Hilgenberg, H.Mell, G.Weiser, J Non-Cryst Solids 97-98, pp. 63-66 (1987).

"Interface-state generation by gold diffusion through SiO2 films on silicon: MOS and neutron-activation results," By P. F. Schmidt, and L. P. Adda, Journal of Applied Physics 45, 1826 (1974).

"Photothermal and photoconductive determination of surface and bulk defect densities in amorphous silicon films" By Z E. Smith, V. Chu, K. Shepard, S. Aljishi, D. Slobodin, J. Kolodzey, and S. WagnerT. L. Chu Appl. Phys. Lett. 50, 1521 (1987).

"Sensitivity and transient response of microwave reflection measurements" By Martin Schöfthaler, and Rolf Brendel, Journal of Applied Physics 77, 3162 (1995).

"Spectral distribution of photoionization cross sections by photoconductivity measurements" by H. G. Grimmeiss, and L-Å. Ledebo, Journal of Applied Physics 46, 2155 (1975).

"Surface effects in hydrogenated amorphous silicon studied by photothermal-deflection experiments" by L.Chahed et.al, Phys Rev B, vol. 43, No. 18, pp. 14488-14497 (1991).

"The study of charge carrier kinetics in semiconductors by microwave conductivity Measurements" By M. Kunst, and G. Beck, Journal of Applied Physics 60, 3558.

\* cited by examiner

OPTICAL CHARACTERISTICS MEASURING DEVICE AND OPTICAL CHARACTERISTICS MEASURING METHOD

CROSS-REFERENCE TO RELATED APPLICATION

This application is based upon and claims the benefit of priority from Japanese Patent Application No. 2018-158564, filed on Aug. 27, 2018, the entire contents of which are incorporated herein by reference.

FIELD

Embodiments described herein relate generally to an optical characteristics measuring device and an optical characteristics measuring method.

BACKGROUND

The optical characteristics of materials such as semiconductors are closely related to the electrical characteristics and physical characteristics of the materials, and are utilized in various fields such as advanced material development, device development, mass production line, and the like. However, the film thickness of a material film in a sample sharply decreases in miniaturized semiconductor devices such as semiconductor memories. For this reason, it is difficult for a measuring instrument such as a spectroscopic ellipsometer, which measures optical characteristics by using reflected light, to accurately measure optical characteristics of the material film.

As a method for measuring the optical characteristics of a material regardless of the film thickness, constant photocurrent method (CPM) is available. However, in order to measure the current flowing in the material film, it is necessary to provide a plurality of electrodes on the material film for the CPM. Therefore, the size of the sample is increased, and the shape of the sample is also limited. In addition, a step of forming electrodes on a sample is required.

Examples of related art include Toshihiro Iki et al. "Construction of Constant Photocurrent Experimental Method for High-Sensitivity Optical Absorption Coefficient Measurement", Journal of Faculty of Engineering, Miyazaki University No. 38; and Marthin Schofthaler et. al. "Sensitivity and transient response of microwave reflection measurements", pp. 3162-3173, J. Appl. Phys. 77(7), 1 Apr. 1995.

DETAILED DESCRIPTION

Figure 1:
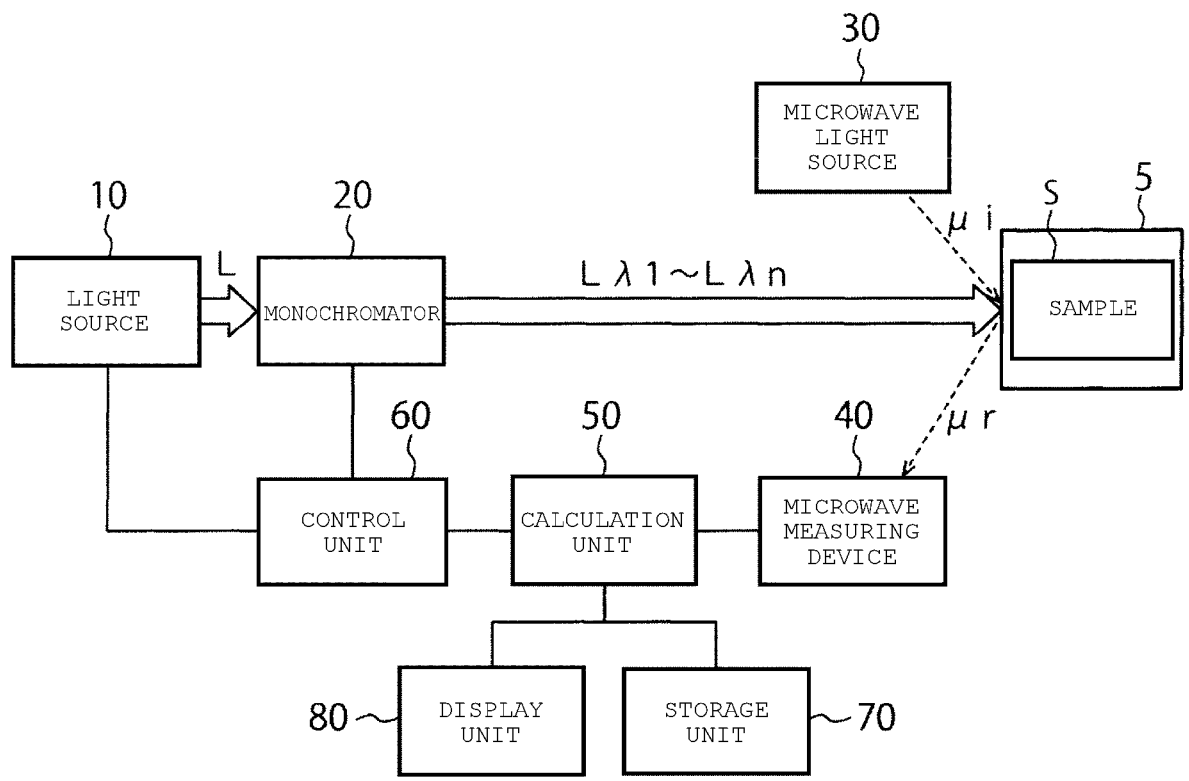
FIG. 1 is a block diagram showing a configuration example of an optical characteristics measuring device according to a first embodiment.

Embodiments herein provide an optical characteristics measuring device and an optical characteristics measuring method capable of easily measuring the optical characteristics of a sample regardless of the film thickness and shape of the sample.

In general, according to one embodiment, an optical characteristics measuring device includes a first light source that is capable of irradiating a sample with light. A second light source is capable of irradiating the sample with microwaves. A measuring device measures microwave power of the reflected waves of the microwaves reflected by the sample (i.e., measures reflection information relating to the microwave energy). A calculation unit calculates a parameter relating to the electrical conductivity of the sample by using the microwave power of the reflected waves measured by the measuring device. A control unit controls the intensity of the light of the first light source so that a parameter becomes approximately a predetermined value. The calculation unit identifies first to n-th intensities of the light at which the parameter becomes approximately the predetermined value for each of the first to n-th wavelengths (n is an integer of 2 or more) of the light and obtains relationships between the first to n-th wavelengths and the first to n-th intensities corresponding to the respective first to n-th wavelengths.

Hereinafter, embodiments of the present disclosure will be described with reference to drawings. The present embodiment does not limit the present disclosure. The drawings are schematic or conceptual, and the ratio of each part is not necessarily the same as the actual one. In the specification and drawings, elements similar to those described above with reference to the drawings are given the same reference numerals, and the detailed description thereof will be omitted as appropriate.

First Embodiment

FIG. 1 is a block diagram showing a configuration example of an optical characteristics measuring device according to a first embodiment. An optical characteristics measuring device 1 includes a stage 5, a light source 10, a monochromator 20, a microwave light source 30, a microwave measuring device 40 (detector), a calculation unit 50 (calculator), a control unit 60 (controller), a storage unit 70 (storage), and a display unit 80 (display). In some embodiments, the calculation unit 50 and control unit 60 may be integrated into a computer. In some embodiments, the measuring device 40, calculation unit 50 and control unit 60 may be integrated into a computer.

The stage 5 is configured so that a sample S to be measured can be placed on it. The light source 10 as a first light source generates light L to be radiated to the sample S. The light L from the light source 10 is light including various wavelengths, for example, white light with wavelengths in the range of 190 nm to 2500 nm. The light source 10 may change the intensity (output) of the light L under the control of the control unit 60.

The monochromator 20 as a wavelength adjusting unit allows light L from the light source 10 of a specific wavelength (any one of $L\lambda 1$ to $L\lambda n$) to pass and irradiate the sample S. The light beams $L\lambda 1$ to $L\lambda n$ are light beams of different wavelengths or wavelength bands. n is an integer of 2 or more. The monochromator 20 may adjust the light to be transmitted to the sample S in the range of $L\lambda 1$ to $L\lambda n$ under the control of the control unit 60. For example, when passing light $L\lambda k$ ($1 \leq k \leq n$), the monochromator 20 blocks light other than the light $L\lambda k$.

The light source 10 may have a plurality of single-wavelength light sources that generate light of different wavelengths. For example, the light source 10 may be a plurality of laser light sources that generate light of different wavelengths. In this case, the monochromator 20 may be provided or may be omitted. The control unit 60 may select and drive one of the single-wavelength light sources from among the light sources 10.

The microwave light source 30 as a second light source irradiates the sample S with microwaves μi. The microwaves μi used in the present embodiment have a wavelength corresponding to a frequency range of 0.3 GHz to 300 GHz, for example. The microwaves μi are reflected by the sample S and enters the microwave measuring device 40 as reflected waves μr. The microwave measuring device 40 as a measuring device measures the microwave power of the reflected waves μr. The microwave power of the reflected waves μr is the microwave power reflected by the free electrons of the sample S.

The calculation unit 50 calculates a parameter relating to electrical conductivity of the sample S based on the microwave power of the reflected waves μr measured by the microwave measuring device 40. This parameter is expressed by a ratio ($\Delta P/P$) of P and $\Delta P$ ($\Delta P = P_L - P$), where the microwave power of the reflected waves μr when no light is radiated is set as P and the microwave power of the reflected waves μr is set as $P_L$ when light (any one of L$\lambda$1 to L$\lambda$n) is radiated. That is, the parameter is the ratio ($\Delta P/P$) of the microwave power P of the reflected waves μr when no light is radiated, to the increment $\Delta P$ of the microwave power of the reflected waves μr when light (any one of L$\lambda$1 to L$\lambda$n) is radiated. The microwave power P is a constant, and the microwave power $P_L$ is a value that increases by radiating light (any one of L$\lambda$1 to L$\lambda$n). Hereinafter, $\Delta P/P$ is also called "parameter".

The parameter $\Delta P/P$ is expressed by Equation 1 using the change in reflectance R of the microwaves and the change in electrical conductivity $\sigma_0$ of the sample S.

$$\frac{\Delta P(\Delta \sigma_0)}{P} \cong \frac{\partial R(\sigma_0)}{\partial \sigma_0} \Delta \sigma_0 \quad \text{[Equation 1]}$$

Here, $\Delta \sigma_0$ is the amount of change of the electrical conductivity (conductance) of the sample S. $\delta R(\sigma_0)/\delta \sigma_0$ represents change in reflectance with respect to the conductance. In Equation 1, $\Delta P$ is expressed as a function $P(\Delta \sigma_0)$ of the amount of change $\Delta \sigma_0$ of the conductance.

According to Equation 1, the parameter $\Delta P/P$ on the left side is a function of the change amount $\Delta \sigma_0$ of the electrical conductivity (conductance) of the sample S. Therefore, the parameter $\Delta P/P$ does not indicate the electrical conductivity itself of the sample S, but may be used as an index related to the electrical conductivity of the sample S. That is, although the calculation unit 50 may not calculate the electrical conductivity of the sample S from the output of the microwave measuring device 40, the parameter $\Delta P/P$ may be calculated, and therefore change in the electrical conductivity of the sample S can be recognized from change in the parameter $\Delta P/P$. For example, when the parameter $\Delta P/P$ decreases, it indicates that the change of the electrical conductivity of the sample S is small. Conversely, when the parameter $\Delta P/P$ rises, it indicates that the change of the electrical conductivity of the sample S is large. Furthermore, when the parameter $\Delta P/P$ is constant, it indicates that there is no change in the electrical conductivity of the sample S. In this manner, the parameter $\Delta P/P$ may be used as an index related to the change amount of the electrical conductivity of the sample S. The calculation unit 50 may indirectly recognize a change in electrical conductivity of the sample S by using the parameter $\Delta P/P$.

Figure 2:
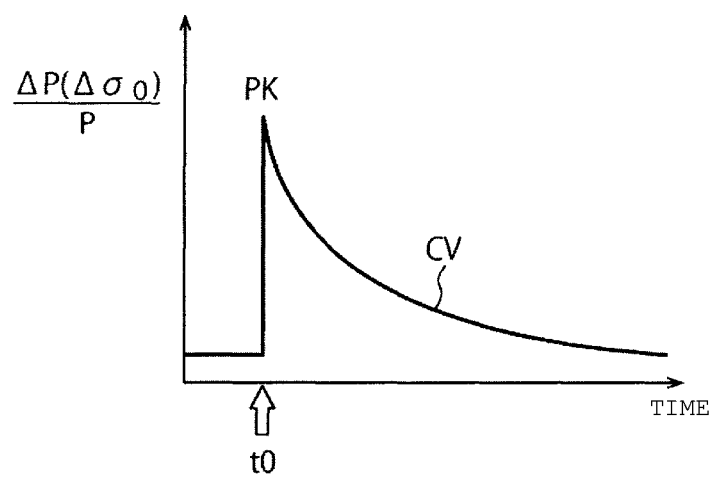
FIG. 2 is a graph showing a parameter $\Delta P/P$.

The control unit 60 controls the intensity of the light L of the light source 10 so that the parameter $\Delta P/P$ calculated in response to any one of the light beams L$\lambda$1 to L$\lambda$n becomes approximately a predetermined value. For example, FIG. 2 is a graph showing the parameter $\Delta P/P$. The vertical axis of this graph is the parameter $\Delta P/P$, and the horizontal axis is time. Either one of the light beams L$\lambda$1 to L$\lambda$n is intermittently radiated in a pulsed manner, and the microwaves μi are also emitted immediately after each pulse. The control unit 60 controls the intensity of the light L of the light source 10 so that a peak PK and/or a curve CV of the parameter $\Delta P/P$ shown in FIG. 2 substantially matches a predetermined value.

The parameter $\Delta P/P$ in FIG. 2 will be described. For example, at t0, when any one of the pulses of the light beams L$\lambda$1 to L$\lambda$n is radiated, the microwave power $P_L$ increases and an increased amount $\Delta P$ of the microwave power $P_L$ with respect to the microwave power P also increases. The microwave power P varies depending on the material, the film thickness, and the like of the sample S, but is a constant when the sample S is the same. Therefore, the parameter $\Delta P/P$ abruptly increases in response to irradiation by any one of the light beams L$\lambda$1 to L$\lambda$n at t0. This means that the electrical conductivity of the sample S has increased in response to irradiation by any one of the light beams L$\lambda$1 to L$\lambda$n. The light beams L$\lambda$1 to L$\lambda$n are emitted in a pulsed manner at t0 and thereafter are not emitted until the next pulse. Therefore, after t0, the parameter $\Delta P/P$ gradually decreases. This means that the electrical conductivity of the sample S gradually returns to a normal value. As described above, the change in the parameter $\Delta P/P$ relates to the change in the electrical conductivity of the sample S. Therefore, it is possible to grasp the change in the electrical conductivity of the sample S in response to irradiation by any one of the different wavelengths of light beams L$\lambda$1 to L$\lambda$n by referring to the change in the parameter $\Delta P/P$ in response to irradiation by the same. As described later in detail, assuming that an intensity is constant, the calculated parameter $\Delta P/P$ may vary depending on the wavelength of the radiate light beam due to an optical characteristic (absorption ratio) of the sample S. Conversely, by controlling the intensity of the light L of the light source 10 for respective wavelengths so that the parameter $\Delta P/P$ becomes approximately the predetermined value, the electrical conductivity of the sample S can be also controlled to a certain value. The calculated parameter $\Delta P/P$ may have a peak PK at t0 and a subsequent curve CV as shown in FIG. 2. For example, when substantially the same height of the peak PK and substantially the same shape of the curve CV are obtained at different measurement environments, it may be possible to assume that the electrical conductivity of the sample S is substantially equal among these measurement environments.

The calculation unit 50 obtains the respective intensities of the light beams L$\lambda$1 to L$\lambda$n when the electrical conductivity of the sample S is made substantially constant by using the relationship between the parameter $\Delta P/P$ and the electrical conductivity of the sample S. The respective intensities of the light beams L$\lambda$1 to L$\lambda$n are used as the optical characteristic of the sample S for analysis and understanding of physical characteristics, confirmation of the result of simulation, and the like.

The storage unit 70 stores wavelengths and intensities of the light beams L$\lambda$1 to L$\lambda$n, the parameter $\Delta P/P$ calculated by the calculation unit 50, and the like. In addition, the storage unit stores the intensities (also referred to as adjusted intensity) of the light beams $L\lambda1$ to $L\lambda n$ when the electrical conductivity of the sample S is substantially constant in association with the wavelengths of the light beams $L\lambda1$ to $L\lambda n$, respectively. The association is not particularly limited, but the same name may be included in a file name, a folder name, and the like in the data.

The display unit 80 displays respective adjusted intensities for the wavelengths of the light beams $L\lambda1$ to $L\lambda n$ in a graph. The adjusted intensities may be converted into absorption rates of the light beams $L\lambda1$ to $L\lambda n$ in the sample S. The absorption rate is the reciprocal of the depth from the irradiated surface where the light radiated on the sample is absorbed as the light proceeds to the interior of the material and of which intensity is $1/e$ (e is Napier's constant). The absorption rate of the light beams $L\lambda1$ to $L\lambda n$ when the electrical conductivity of the sample S is substantially constant is hereinafter also referred to as the adjusted absorption rate. Therefore, high adjusted intensity of light beams $L\lambda1$ to $L\lambda n$ means that the light absorption rate of the sample S is relatively low. This is because it is necessary to increase the adjusted intensities of the light beams $L\lambda1$ to $L\lambda n$ in order to obtain the sample S having a predetermined electrical conductivity. On the other hand, low adjusted intensity of the light beams $L\lambda1$ to $L\lambda n$ means that the light absorption rate of the sample S is relatively high. This is because if the light absorption rate of the sample S is high, even if the intensities of the light beams $L\lambda1$ to $L\lambda n$ are low, it is possible to obtain the sample S having a predetermined electrical conductivity. Therefore, the display unit 80 may display the adjusted absorption rate corresponding to the adjusted intensity as a graph instead of the adjusted intensity.

Figure 3:
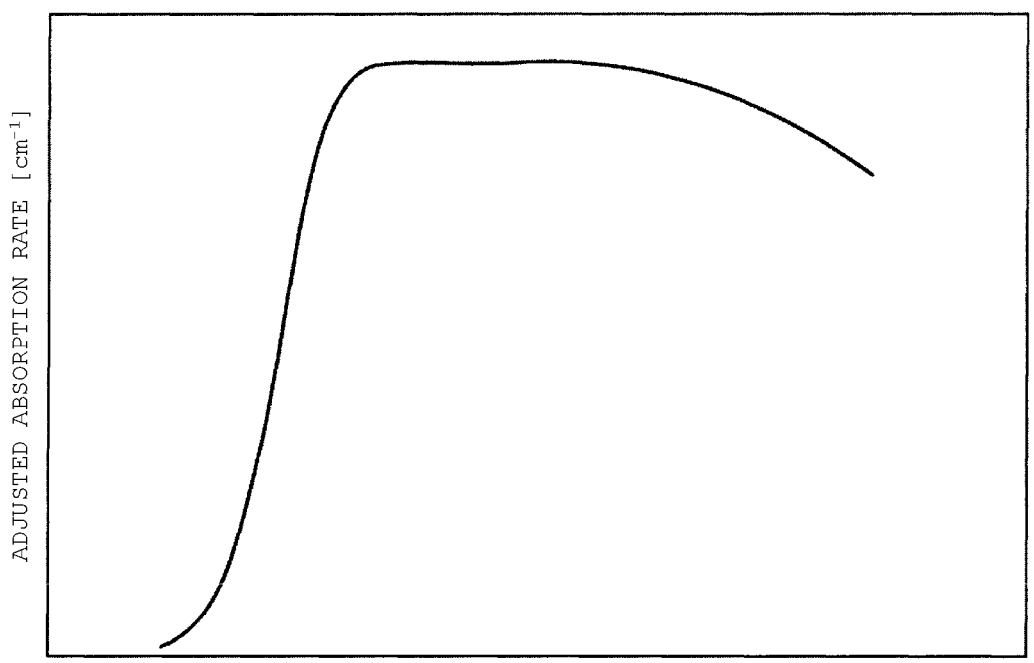
FIG. 3 is an example of a graph displayed on a display unit.

FIG. 3 is an example of a graph displayed on the display unit 80. In this graph, the vertical axis shows the adjusted absorption rate of the sample S. The horizontal axis indicates the energy of the light beams $L\lambda1$ to $L\lambda n$. Energy of the light beams $L\lambda1$ to $L\lambda n$ may be expressed as $h \cdot c/\lambda$. Here, h is Planck's constant, c is the speed of light, and $\lambda$ is the wavelength of lights beams $L\lambda1$ to $L\lambda n$. Since the energy of the light beams $L\lambda1$ to $L\lambda n$ is proportional to the reciprocal of these wavelengths, the energy decreases as the wavelengths of the light beams $L\lambda1$ to $L\lambda n$ become longer.

In this way, using the microwaves $\mu i$, the optical characteristics measuring device 1 according to the present embodiment may calculate the parameter $\Delta P/P$ related to the electrical conductivity of the sample S, and measure optical characteristics (for example, adjusted intensity, adjusted absorption rate) of the sample S by using the parameter $\Delta P/P$. The microwaves $\mu i$ may be used to irradiate the sample S and this may be measured without providing an electrode on the sample S. Further, the microwaves $\mu i$ may be used to irradiate the sample S and this may be measured regardless of the film thickness and shape of the sample S. Therefore, in the present embodiment, it is possible to measure the optical characteristics of the sample S in a non-contact manner without being limited by the size and shape of the sample S. Therefore, in the present embodiment, for example, the optical characteristics of a thin film formed on a semiconductor substrate having a large area may be mapped.

Micro photoconductivity decay (PCD) is a method of analyzing the electrical conductivity (conductance, free carrier concentration) itself of a sample by using reflected waves of microwaves. However, at present, it is difficult to directly obtain the electrical conductivity of a sample with micro PCD. In contrast, in the present embodiment, the fact that that the change in the electrical conductivity of the sample S may be grasped indirectly by the change of the parameter $\Delta P/P$ instead of obtaining the electrical conductivity itself of the sample S is utilized for PCM, and the intensities of the light beams $L\lambda1$ to $L\lambda n$ are controlled referring to the parameter $\Delta P/P$ so that the electrical conductivity of the sample S is substantially constant. Therefore, the present embodiment is a different technology from the micro PCD in which the electrical conductivity itself of the sample is to be analyzed.

Next, the optical characteristics measuring method according to the present embodiment will be described.

Figure 4:
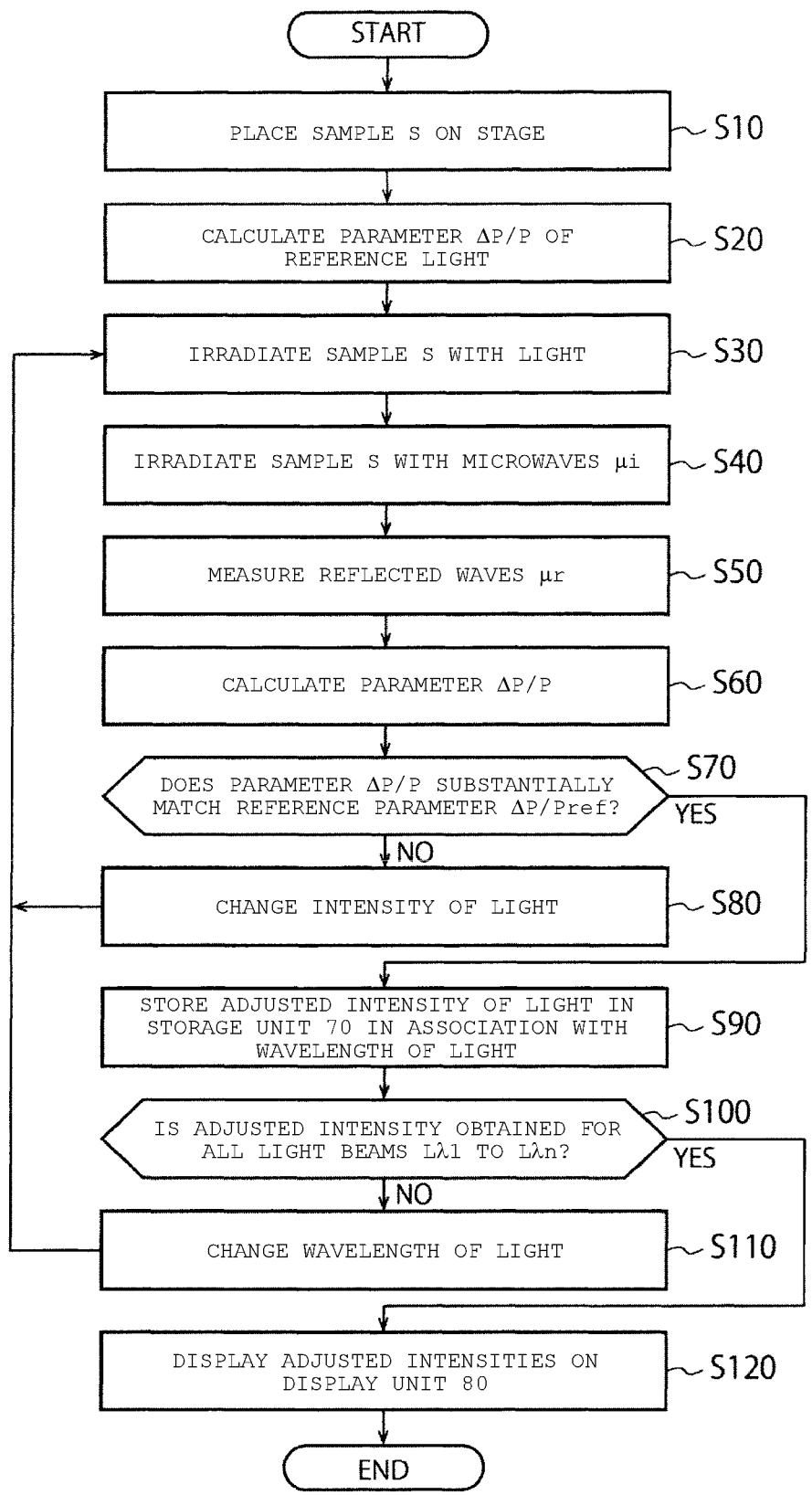
FIG. 4 is a flowchart showing an example of an optical characteristics measuring method according to the first embodiment.

FIG. 4 is a flowchart showing an example of the optical characteristics measuring method according to the first embodiment.

First, the sample S is placed on the stage (S10). The microwave power P of the reflected waves $\mu r$ when the sample S is not irradiated with light is measured beforehand.

Next, the sample S is irradiated with light having a certain wavelength and a certain intensity as reference light, and is irradiated with the microwaves $\mu i$. As a result, the calculation unit 50 calculates the parameter $\Delta P/P$ of the reference light (S20). The parameter $\Delta P/P$ of the reference light is stored in the storage unit 70. The parameter $\Delta P/P$ of the reference light may be displayed on the display unit 80 as a graph as shown in FIG. 2. Hereinafter, the parameter $\Delta P/P$ of the reference light is referred to as reference parameter $\Delta P/Pref$.

Next, the sample S is irradiated with the light $L\lambda1$ as a first wavelength (S30). Simultaneously with or immediately after the irradiation with the pulse of the light $L\lambda1$, the sample S is irradiated with the microwaves $\mu i$ (S40). The microwaves $\mu i$ are emitted to the irradiation position of the light $L\lambda1$, and a part thereof is measured by the microwave measuring device 40 as the reflected waves $\mu r$ (S50).

Next, the calculation unit 50 calculates the parameter $\Delta P/P$ using the microwave power of the reflected waves $\mu r$ measured by the microwave measuring device 40 (S60).

Next, the calculation unit 50 compares the parameter $\Delta P/P$ obtained in step S50 with the reference parameter $\Delta P/Pref$ (S70). When the parameter $\Delta P/P$ is different from the reference parameter $\Delta P/Pref$ (NO in S70), the control unit 60 changes the intensity of the light $L\lambda1$ (S80) and again executes steps S30 to S60 (S80). For example, when the parameter $\Delta P/P$ is smaller than the reference parameter $\Delta P/Pref$, the control unit 60 increases the intensity of the light $L\lambda1$. When the parameter $\Delta P/P$ is larger than the reference parameter $\Delta P/Pref$, the control unit 60 lowers the intensity of the light $L\lambda1$.

On the other hand, when the parameter $\Delta P/P$ substantially matches the reference parameter $\Delta P/Pref$ (YES in S70), the calculation unit 50 stores the intensity (first adjusted intensity) of the light $L\lambda1$ at that time in the storage unit 70 in association with the wavelength (first wavelength) of the light $L\lambda1$ (S90). The fact that the parameter $\Delta P/P$ closely coincides with the reference parameter $\Delta P/Pref$ means that the peak PK and/or the curve CV in FIG. 2 are substantially the same, achieving not only perfect matching, but also allowing some degree of misalignment. The allowable values may be set by a manufacturer or a user.

Next, the control unit 60 controls the monochromator 20 to change the wavelength of the light (NO in S100; S110) and executes steps S30 to S90. For example, the monochromator 20 changes from the light $L\lambda1$ to the light $L\lambda2$. Thereafter, steps S30 to S90 are executed. As a result, the adjusted intensity is also obtained for the light $L\lambda2$. The calculation unit 50 stores the adjusted intensity (second adjusted intensity) of the light Lλ2 in association with the wavelength (second wavelength) of the light Lλ2 in the storage unit 70.

Likewise, steps S30 to S90 are executed for the light beams Lλ3 to Lλn (NO in S100). As a result, the calculation unit 50 may obtain an adjusted intensity of each of the light beams Lλ3 to Lλn. The adjusted intensities (third to n-th adjusted intensities) of the light beams Lλ3 to Lλn are also stored in association with the wavelengths of the light beams Lλ3 to Lλn (third to n-th wavelengths) in the storage unit 70.

When an adjusted intensity is obtained for all the light beams Lλ1 to Lλn (YES in S100), the calculation unit 50 displays the first to n-th wavelengths of the light beams Lλ1 to Lλn and the first to n-th adjusted intensities corresponding to the first to n-th wavelengths on the display unit 80 (S120). At this time, as shown in FIG. 3, the wavelength may be converted into energy. The adjusted intensity may be converted to an adjusted absorption rate. In this case, the first to n-th adjusted intensities are respectively converted into the first to n-th adjusted absorption rates.

The order of radiation of the light beams Lλ1 to Lλn is random. Also, the number of times of radiation of a certain light Lλk (1≤k≤n) (the number of loops in steps S30 to S80) is also not particularly limited. There is no particular limitation as long as the value of n is also 2 or more.

As described above, according to the present embodiment, for each of the light beams Lλ1 to Lλn having the first to n-th wavelengths, the first to n-th adjusted intensities at which the parameter ΔP/P indicated by the microwave power of the reflected waves μr of the microwaves μi becomes substantially the predetermined value (i.e., assumes the predetermined value or a value approximate to the predetermined value) are identified. Then, the relationships between the first to n-th wavelengths and the first to n-th adjusted intensities or the first to n-th adjusted absorption rates corresponding to the first to n-th wavelengths are obtained. The sample S may be irradiated with microwaves (microwave energy) μi and measured without providing an electrode on the sample S and regardless of the film thickness and shape of the sample S. Therefore, in the present embodiment, it is possible to measure the optical characteristics of the sample S in a non-contact manner without being limited by the size and shape of the sample S. For example, in the optical characteristics measuring device 1 according to the present embodiment, it is possible to measure the wavelength dispersion of the optical absorption rate even if it is a very thin material film whose product of the light absorption rate and the film thickness is less than 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical characteristics measuring device, comprising:
    a first light source that irradiates a sample with a light;
    a second light source that irradiates the sample with a microwave energy;
    a detector configured to measure a microwave power of the microwave energy reflected from the sample;
    a calculator configured to calculate a parameter relating to electrical conductivity of the sample by using the microwave power of the reflected waves measured by the detector;
    a controller configured to control an intensity of the light of the first light source;
    a storage,
    wherein the calculator is configured to specify first to n-th intensities of the light at which the parameter becomes approximately the predetermined value for each of the first to n-th wavelengths, where n is an integer of 2 or more, of the light and thereby obtain relationships between the first to n-th wavelengths and the first to n-th intensities corresponding to each of the first to n-th wavelengths,
    wherein the calculator is configured to calculate, as the parameter, the ratio between the microwave power when the light is not radiated and an increased amount of the microwave power resulting from radiating the light,
    wherein the calculator is configured to obtain first to n-th absorption rates of the light with respect to the first to n-th wavelengths from the relationships between the first to n-th wavelengths and the first to n-th intensities,
    wherein the storage is configured to store information relating to the first to n-th wavelengths and the first to n-th intensities in association with each other, and
    wherein
        when the parameter is smaller than a reference parameter, the controller is configured to increase the intensity of the light,
        when the parameter is larger than the reference parameter, the controller is configured to lower the intensity of the light, and
        when the parameter substantially matches the reference parameter, the calculator is configured to store the intensity of the light into the storage in association with the wavelength of the light.

2. The optical characteristics measuring device according to claim 1, wherein the light has a wavelength in a range between 190 nm and 2500 nm.

3. The optical characteristics measuring device according to claim 2, further comprising a monochromator configured to allow light of a specific wavelength to pass to irradiate the sample with the light.

4. The optical characteristics measuring device according to claim 1, wherein the microwave energy has a frequency range between 0.3 GHz and 300 GHz.

5. An optical characteristics measuring method using an optical characteristics measuring device including a first light source that irradiates a sample with a light, a second light source that irradiates the sample with a microwave energy, a detector that measures microwave power of a microwave reflection from the sample, a computer that calculates using the microwave power of the reflected waves and controls the light of the first light source, the method comprising:
    irradiating the sample with light of a first wavelength;
    irradiating the sample with microwave energy;
    calculating a parameter relating to electrical conductivity of the sample using the microwave power of the reflected waves measured by the measuring device;
    specifying first to n-th intensities of the light at which the parameter becomes approximately the predetermined value for each of the first to n-th wavelengths, where n is an integer of 2 or more, of the light and thereby obtain relationships between the first to n-th wavelengths and the first to n-th intensities corresponding to each of the first to n-th wavelengths;

calculating, as the parameter, the ratio between the microwave power when the light is not radiated and an increased amount of the microwave power resulting from radiating the light;

obtaining first to n-th absorption rates of the light with respect to the first to n-th wavelengths from the relationships between the first to n-th wavelengths and the first to n-th intensities;

storing information relating to the first to n-th wavelengths and the first to n-th intensities in association with each other;

when the parameter is smaller than a reference parameter, increasing the intensity of the light;

when the parameter is larger than the reference parameter, lowering the intensity of the light; and when the parameter substantially matches the reference parameter, storing the intensity of the light in association with the wavelength of the light of the first light source.

6. The optical characteristics measuring method according to claim 5, further comprising:

obtaining a first absorption rate of the light of the sample with respect to the first wavelength, from the relationship between the first wavelength and the first intensity.

7. The optical characteristics measuring method according to claim 5, further comprising:

obtaining second to n-th absorption rates of the light of the sample with respect to the second to n-th wavelengths, from the relationships between the second to n-th wavelengths and the second to n-th intensities.

8. A system for measuring optical characteristics of a sample, the system comprising:

a first light source emitting a first electromagnetic wave to a sample;

a second light source emitting a second electromagnetic wave to the sample;

a detector configured to receive reflection information relating to a reflection of the second electromagnetic wave;

a storage; and a computer configured to:
  calculate a parameter based on the reflection information;
  control an intensity of the first electromagnetic wave of the first light source:
  specify first to n-th intensities of the first electromagnetic wave at which the parameter becomes approximately the predetermined value for each of the first to n-th wavelengths, where n is an integer of 2 or more, of the first electromagnetic wave and thereby obtain relationships between the first to n-th wavelengths and the first to n-th intensities corresponding to each of the first to n-th wavelengths;
  calculate, as the parameter, the ratio between a first calculated parameter based on the reflection information when the first electromagnetic wave is not radiated and a second calculated parameter representing an increased amount based on the reflection information resulting from radiating the first electromagnetic wave;
  obtain first to n-th absorption rates of the first electromagnetic wave with respect to the first to n-th wavelengths from the relationships between the first to n-th wavelengths and the first to n-th intensities, wherein the storage is configured to store information relating to the first to n-th wavelengths and the first to n-th intensities in association with each other;
  when the parameter is smaller than a reference parameter, increase the intensity of the first electromagnetic wave;
  when the parameter is larger than the reference parameter, lower the intensity of the first electromagnetic wave; and
  when the parameter substantially matches the reference parameter, store the intensity of the first electromagnetic wave into the storage in association with the wavelength of the first electromagnetic wave.

9. The system of claim 8, wherein the first electromagnetic wave has a wavelength in a range between 190 nm and 2500 nm.

10. The system of claim 9, further comprising a monochromator configured to allow an electromagnetic wave having a specific wavelength to pass and irradiate the sample with electromagnetic wave.

11. The system of claim 8, wherein the second electromagnetic wave has a frequency range between 0.3 GHz and 300 GHz.

12. The system of claim 8, further comprising a display configured to display respective adjusted intensities for the wavelengths of the first electromagnetic wave.

* * * * *